US006518764B2

(12) United States Patent
Shirato

(10) Patent No.: US 6,518,764 B2
(45) Date of Patent: Feb. 11, 2003

(54) RELAY DRIVING APPARATUS

(75) Inventor: Keiji Shirato, Kanagawa (JP)

(73) Assignee: Sony Corporation, Tokyo (JP)

( * ) Notice: Subject to any disclaimer, the term of this patent is extended or adjusted under 35 U.S.C. 154(b) by 10 days.

(21) Appl. No.: 09/818,735

(22) Filed: Mar. 27, 2001

(65) Prior Publication Data

US 2001/0035755 A1 Nov. 1, 2001

(30) Foreign Application Priority Data

Mar. 29, 2000 (JP) ....................................... 2000-095288

(51) Int. Cl.[7] ................................................ G01R 31/00
(52) U.S. Cl. ....................................... 324/413; 361/187
(58) Field of Search ......................... 324/418; 361/187; 318/778

(56) References Cited

U.S. PATENT DOCUMENTS

| | | | | | |
|---|---|---|---|---|---|
| 4,607,205 | A | * | 8/1986 | Kito | 318/778 |
| 5,930,104 | A | * | 7/1999 | Kadah | 361/187 |
| 6,025,582 | A | * | 2/2000 | Kang | 219/757 |

FOREIGN PATENT DOCUMENTS

| | | | |
|---|---|---|---|
| DE | 36 23 908 | * | 1/1988 |
| JP | 05-266772 | * | 10/1993 |
| JP | 07-29675 | * | 1/1995 |

* cited by examiner

*Primary Examiner*—Christine K. Oda
(74) *Attorney, Agent, or Firm*—Jay H. Maioli

(57) ABSTRACT

A relay driving apparatus to be automatically restores a relay driving state if the relay is inadvertently turned off. The relay driving apparatus supplies a predetermined rated voltage to the relay RL1 to shift the relay RL1 to a driving state and then reduces the voltage to maintain the driving state of the relay RL1. The driving state of the relay RL1 is monitored, and on the basis of the monitoring result the relay RL1 is again provided with the rated driving voltage. Alternatively, the rated voltage is periodically supplied to the relay RL1 during the driving state, or after a predetermined rated voltage is supplied to the relay RL2 to set the relay RL2 to a driving state or non-driving state, the state is monitored and the relay RL2 is periodically subjected to the rated driving operation on the basis of the monitoring result, thereby enhancing the operation reliability and promoting energy savings.

6 Claims, 6 Drawing Sheets

RELAY DRIVING APPARATUS

BACKGROUND OF THE INVENTION

1. Field of the Invention

The present invention relates to a relay driving apparatus, and is suitably applied to a relay driving circuit in a television set.

2. Description of the Related Art

There has been hitherto known a relay driving circuit for opening/closing a main power source switch in a television set or the like on the basis of an operating signal supplied from a remote controller or the like.

The relay driving circuit is equipped with a main power source switch, a relay coil and a variable iron piece therein, and when the variable iron piece is attached (attract) to the iron core inside the relay coil by the relay coil, the main power source switch is turned on interlockingly with the adsorption operation.

In the case where the main power source switch is made to operate under on-state, when a user carries out a predetermined input operation to turn on the main power source switch in the television set through input means such as a remote controller or the like, the relay driving circuit receives an operating signal supplied from the remote controller or the like, and in response to the operating signal the relay driving circuit supplies a rated voltage to the relay coil.

The rated voltage can make the relay coil generate enough magnetic force to move the movable iron piece and attach it to the iron core. Therefore, under application of the rated voltage, the movable iron piece disposed away from the iron core inside the relay coil is moved and attached to the iron core by the relay coil, thereby turning on the main power source switch which operates interlockingly with the attachment operation.

Under the state that the main power source switch is set to an on-operation state (that is, the movable iron piece is attached to the iron core of the relay coil), the relay driving circuit supplies a holding voltage in place of the rated voltage which has been supplied until now.

With the holding voltage, the relay coil which makes the movable iron piece be attached to the iron core can generate enough magnetic force to keep the attachment state, whereby the relay coil keeps the movable iron piece to be attached to the iron core. Accordingly, the on-state of the main power source switch is kept, and the main power is supplied to each circuit portion in the television set.

In the relay driving circuit thus constructed, the voltage for keeping the attachment of the movable iron piece (holding voltage V2) is set to about the half of the rated voltage V1. The power consumption in this case is equal to about a quarter of the power consumption when the on-state of the main power source switch is kept with the rated voltage of V1 at all times.

However, when the movable iron piece is detached from the iron core due to reduction of AC (Alternating current) voltage, an external impact or the like under the state that the main power source switch is kept under the on-state, it has been hitherto difficult for the relay driving circuit to attach the movable iron piece to the iron core again and restore the main power source switch to the on-state.

SUMMARY OF THE INVENTION

The present invention has been implemented in view of the foregoing description, and has an object to provide a relay driving apparatus which can enhance the operation reliability with promoting energy saving.

In order to attain the above object, a relay driving apparatus for temporarily subjecting a relay to a rated-driving operation to shift the relay to a driving state by supplying a predetermined rated voltage to the relay, and then reducing the voltage to keep the driving state of the relay, is characterized in that the driving state of the relay is monitored, and on the basis of the monitoring result, the relay is subjected to the rated driving operation or the rated voltage is periodically supplied to the relay kept under the driving state, thereby enhancing the operation reliability with promoting energy saving.

DETAILED DESCRIPTION OF THE PREFERRED EMBODIMENTS

Preferred embodiments according to the present invention will be described hereunder with reference to the accompanying drawings.

[First Embodiment]

Figure 1:
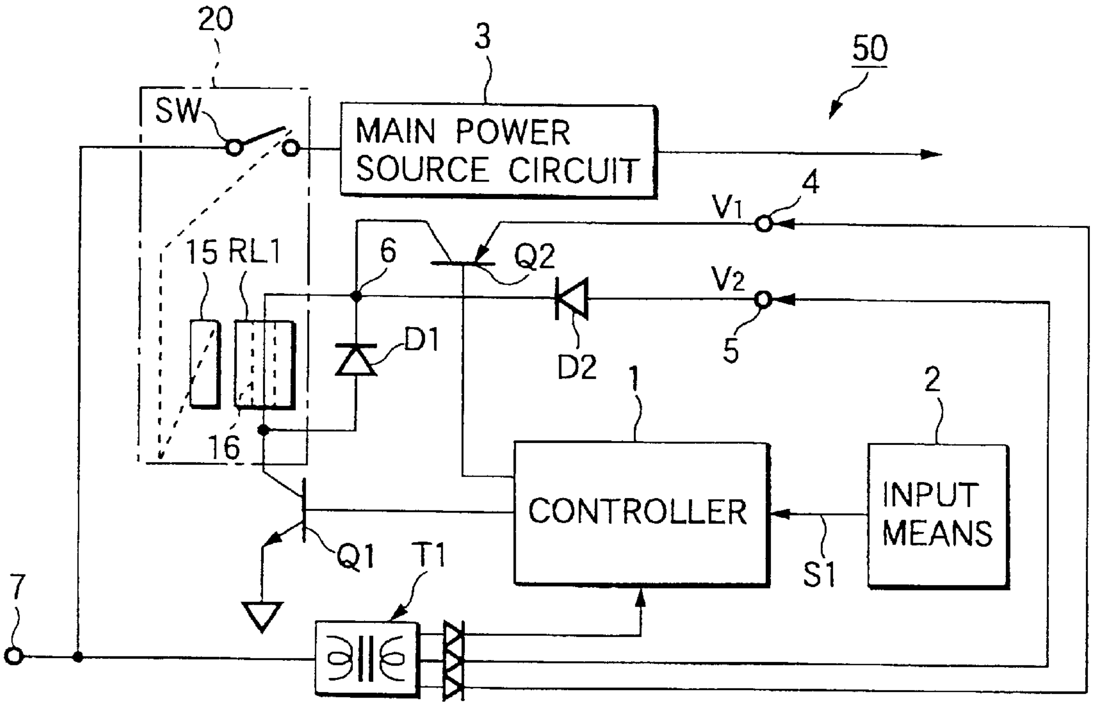
FIG. 1 is a block diagram showing the overall construction of a relay driving circuit according to a first embodiment of the present invention.

In FIG. 1, reference numeral 50 represents a relay driving circuit in a television set as a whole. An AC (Alternating Current) voltage supplied from a commercial power source input terminal 7 is converted to a DC (Direct Current) voltage having a rated level in a transformer T1, and supplied to an input terminal 4. In addition, the AC voltage is also converted to a DC voltage having a holding level, and supplied to an input terminal 5. At this time, the DC voltage supplied to the input terminal 4 (FIG. 1) is set to a rated voltage with which a relay coil RL1 can generate enough magnetic force to move a movable iron piece 15 and attach it to the relay coil RL1. The DC voltage supplied to the input terminal 5 is set to a holding voltage V2 which is equal to about the half of the rated voltage V1 and with which the relay coil RL1 to which the movable iron piece 15 is attached can generate enough magnetic force to keep the attachment state.

When the main power source SW is kept under the on-state, the AC voltage supplied from the commercial power source input terminal 7 is converted to the DC voltage in a main power source circuit 3, and then supplied to each circuit portion (not shown) in the television set. The respective circuit portions of the television set carry out various processing on the basis of the DC voltage supplied from the relay driving circuit 50.

An iron core 16 is inserted through the relay coil RL1, and when the movable iron piece 15 disposed away from the relay coil RL1 is attached to the iron core 16 in the relay coil RL1, the main power source switch SW is turned on interlockingly with the attachment operation of the movable iron piece 15.

When a user carries out a predetermined input operation of turning on the main power source switch through input means 2 such as a remote commander or the like to set the main power source switch SW to an on-state, the input means 2 supplies an operating signal S1 corresponding to the operation concerned to a controller 1.

The controller 1 is connected to a PNP type transistor Q2 for supplying the rated voltage V1 through the input terminal 4 to the relay coil RL1, a diode D2 for supplying the holding voltage V2 through the input terminal 5 to the relay coil RL1 and an NPN type transistor Q1 for on/off-operating the relay coil current. When the controller 1 is supplied with the operating signal S1 from the input means 2, it operates to increase the base voltage of the transistor Q1 and lower the base voltage of the transistor Q2. With this operation of the controller, the transistor Q2 operates under on-state to supply the rated voltage V1 through the input terminal 4 to the relay coil RL1 ($t_0$ in FIG. 2B), and also the transistor Q1 operates under on-state to supply the rated voltage V1 to the relay coil RL1 ($t_0$ in FIG. 2C).

Figure 2A:
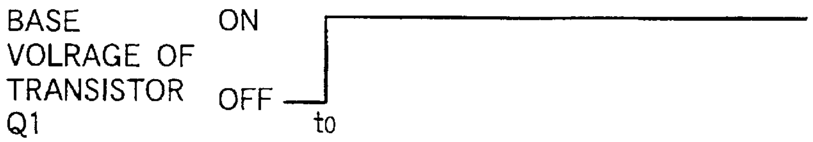
FIGS. 2A to 2D are schematic diagrams showing the correlation between the voltage of a transistor, the voltage of a relay coil and the current of the relay coil.
Figure 2B:
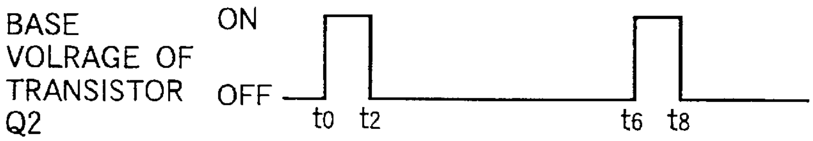

Accordingly, when the relay coil RL1 is supplied with the rated voltage V1 through the input terminal 4, the relay coil RL1 makes the movable iron piece move and attach to the iron core 16 in the relay coil ($t_1$ in FIG. 2D) with the magnetic force which is induced by the rated current flowing through the relay coil RL1, thereby turning on the main power source switch.

The main power source switch SW is set to the on-operation state as described above. At this time, the rated voltage V1 is larger than the holding voltage V2, so that the diode D2 is reversely biased and set to a non-conduction state ($t_0$ in FIG. 2C).

Figure 3:
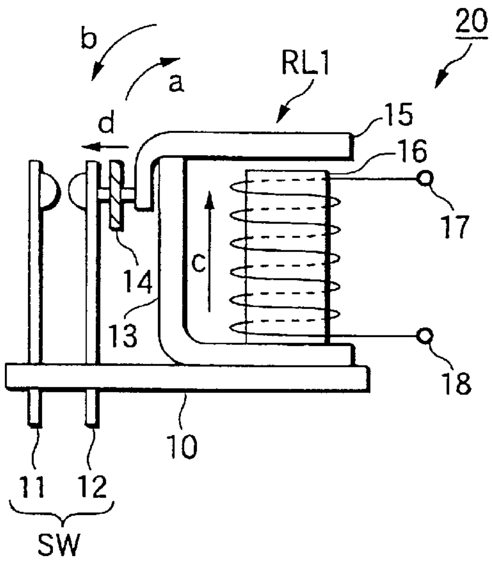
FIG. 3 is a block diagram showing the construction of a switch operating portion.

FIG. 3 shows the operation relationship between the relay coil RL1 in a switch operating portion 20 and the main power source switch SW, and it is equipped with a main power source switch SW comprising a fixed contact point 11 and a movable contact point 12 and a movable iron piece holding portion 13 which are disposed on a table 10. The movable iron piece 15 is mechanically connected to the movable contact point 12 through a transfer member 14. The movable iron piece 15 is supported by the movable iron piece holding portion 13, and the movable iron piece holding portion 13 is rotated in the directions indicated by arrows a and b around the contact point thereof with the movable iron piece holding portion 13.

The movable iron piece holding portion 13 supports the relay coil RL1 through which the cylindrical iron core 16 is inserted, and the movable iron piece 15 is kept away from the iron core 16 under the state that no voltage is applied to the relay coil RL1.

That is, the movable contact point 12 is not brought into contact with the fixed contact point 11 (the main power source switch SW (FIG. 1) is set to the off-state) under the state that the movable iron piece 15 is not attached to the iron core 16.

Here, when the rate voltage V1 is applied through the input terminal 4 (FIG. 1) and the coil input terminal 17 in this order, enough magnetic force to move the movable iron piece 15 is generated in the direction of an arrow c in the relay coil RL1, whereby the relay coil RL1 attaches the movable iron piece 15 to the iron core 16.

Accordingly, the movable iron piece 15 is rotated in the direction of the arrow a to move the transfer member 14 in the direction of an arrow d, whereby the movable contact point 12 is brought into contact with the fixed contact point 11 (the main power source SW (FIG. 1) is set to the on-state) through the movement of the transfer member 14 in the direction of the arrow d.

As described above, the main power source switch SW is turned on when the movable iron piece 15 is moved and attached to the iron core 16 by the relay coil RL1.

As described above, upon reception of the operation signal S1 from the input means 2 by the controller 1, the movable iron piece 15 is moved and attached to the iron core 16 by the relay coil RL1. After a predetermined time elapses from the time when the main power source switch SW is set to the on-state, the controller 1 increases the base voltage of the transistor Q2 to set the transistor Q2 to the off-state and interrupt the rated voltage V1 supplied through the input terminal 4 ($t_2$ in FIG. 2B).

Figure 2C:
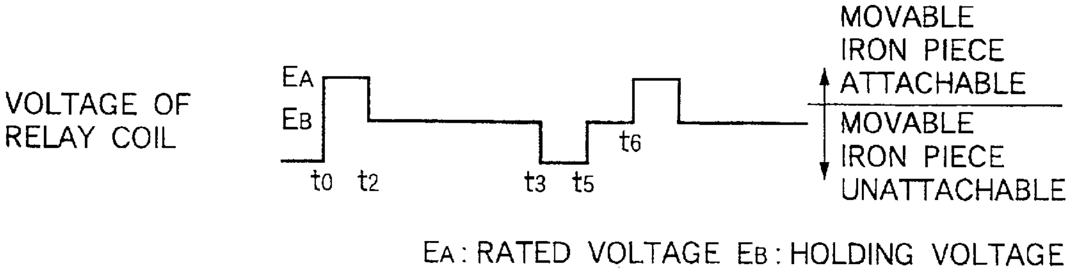
Figure 2D:
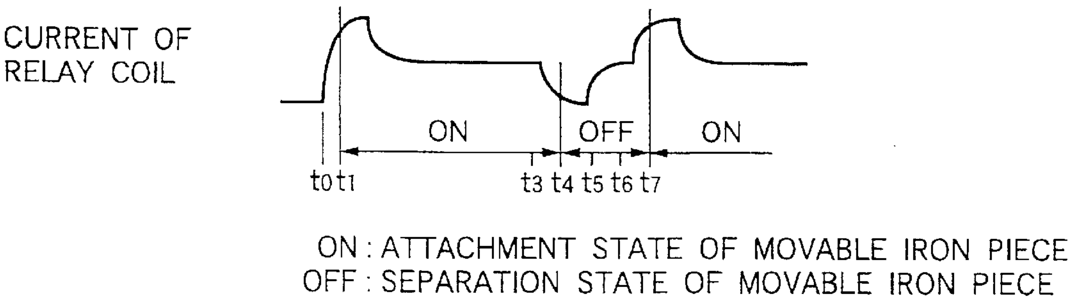

At this time, the controller 1 maintains the on-operation of the transistor Q1, whereby only the holding voltage V2 is supplied to the relay coil RL1 through the input terminal 5 and the diode D2 in this order ($t_2$ in FIG. 2C). As a result, the magnetic force to merely keep the attachment of the movable iron piece 15 to the iron core 16 is generated in the direction of the arrow c in the relay coil RL1. In this case, the magnetic resistance between the movable iron piece 15 and the iron core 16 is reduced because the movable iron piece 15 is attached to the iron core 16, and thus the relay coil RL1 can keep the attachment state between the iron core 16 and the movable iron piece 15 with only the holding voltage. Therefore, the main power source switch SW can be kept to the on-operation state.

Accordingly, the alternating voltage is continuously applied to a main power source 3 (FIG. 1), and the main power source circuit 3 converts the alternating voltage supplied from the commercial power source input terminal 7 to the DC voltage and then output it to each circuit portion (not shown) in the television set, whereby the respective circuit portions of the television set can carry out various processing.

The diode D2 is provided to prevent the current (voltage) flowing in the opposite direction (from the connecting midpoint 6 to the input terminal 5), and the diode D1 connected in parallel to the relay coil RL1 serves as a surge absorbing diode.

As described above, after the predetermined time elapses from the time when the operation signal S1 is supplied, the controller 1 supplies only the holding voltage V2 to the relay coil RL1. Accordingly, since the holding voltage V2 is equal to about the half of the rated voltage V1, the power consumption at this time is equal to about a quarter of the power consumption when only the rated voltage V1 to move the movable iron piece 15 and attach it to the iron core is supplied to the relay coil RL1. Therefore, the relay driving circuit 50 can enhance the energy saving.

Further, under the state that only the holding voltage V2 is applied to the relay coil RL1 (that is, the state that the main power source switch SW is set to the on-operation state is kept), the controller 1 periodically reduces the base voltage of the transistor Q2 for a fixed time ($t_6$ to $t_8$ in FIG. 2C).

Accordingly, the controller 1 serving as the control means periodically supplies the relay coil RL1 with the rated voltage V1 enough to make the movable iron piece 15 move and attach to the iron core 16 ($t_6$ in FIG. 2B). Accordingly, in response to instantaneous reduction of the AC voltage (that is, reduction of the holding voltage V2 supplied to the relay coil RL1 ($t_3$ to $t_5$ in FIG. 2C), the voltage (current) supplied to the relay coil RL1 is reduced ($t_3$ to $t_5$ in FIG. 2D). Therefore, even when the movable iron piece 15 is away from the iron core 16 (that is, the main power source switch SW is set to the off-state), the relay coil RL1 is periodically supplied with the rated voltage V1 from the input terminal 4 ($t_6$ in FIG. 2C), whereby the relay coil RL1 can make the movable iron piece 15 move and attach to the iron core 16 again ($t_6$ to $t_7$ in FIG. 2D) by the magnetic force generated at this time, thereby setting the main power source switch SW to the on-state again.

In the case where the main power source switch is made to operate in the off-state, when a user carries out a predetermined input operation of turning out the main power source switch through the input means 2 such as a remote commander or the like, the input means 2 supplies the operation signal S1 corresponding to the operation concerned to the controller 1. Upon receiving the operation signal S1 from the input means 2, the controller 1 reduces the base voltage of the transistor Q1, and also increases the base voltage of the transistor Q2, whereby no rated voltage is supplied to the relay coil RL1. Accordingly, the movable iron piece 15 is disposed away from the iron core 16 in the relay coil RL1 and thus the main power source switch SW is set to the off-operation state.

In the above construction, the controller 1 controls the on-operation/off-operation of the transistors Q1 and Q2 to periodically supply the rated voltage V1 to the relay coil RL1, whereby the rated current is periodically supplied to the relay coil RL1. In this case, the relay coil RL1 brings enough magnetic force to periodically make the movable iron piece 15 move and attach to the iron core 16.

Accordingly, even when the movable iron piece 15 is away from the iron core 16 in the relay coil RL1, the controller 1 can make the movable iron piece 15 move and attach to the iron core 16 again because the rated voltage is periodically supplied to the relay coil RL1.

Further, when the rated voltage V1 is not supplied to the relay coil RL1, the controller 1 supplies only the holding current (holding voltage V2) to the relay coil RL1, whereby the controller 1 can promote the energy saving to the relay driving circuit 50.

According to the above construction, it is controlled so that the rated voltage is periodically supplied to the relay coil RL1 while the holding voltage is supplied to the relay coil RL1. Accordingly, even when the movable iron piece 15 is away from the iron core 16, the movable iron piece 15 can be automatically restored with keeping the energy saving. Therefore, the relay driving circuit can automatically restore the supply of the main power source voltage to each circuit portion (not shown) of the television set, and the operation reliability can be enhanced with promoting the energy saving.

[Second Embodiment]

Next, a second embodiment according to the present invention will be described. The corresponding parts to those of FIG. 1 are represented by the same reference numerals.

Figure 4:
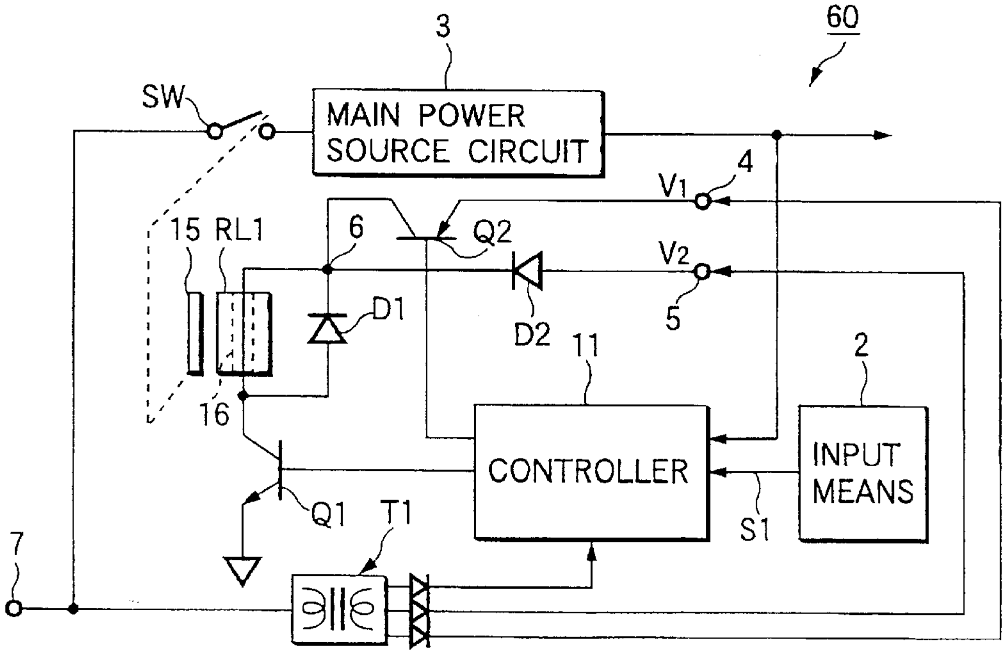
FIG. 4 is a block diagram showing the overall construction of a relay driving circuit according to a second embodiment of the present invention.

In FIG. 4, reference numeral 60 represents a relay driving circuit in a television set as a whole. When the main power source switch SW is set to the on-operation state, a user carries out a predetermined operation of turning on the main power from input means 2 such as a remote commander or the like, and the input means 2 supplies the operation signal S1 corresponding to the user's operation to a controller 11.

The controller 11 is connected to an PNP type transistor Q2 for supplying a rated voltage V1 through an input terminal 4, a diode D2 for supplying a holding voltage V2 (which is equal to about the half of the rated voltage V1) through an input terminal 5, and an NPN type transistor Q1 for on/off-operating the relay coil current. When the controller 11 serving as driving means is supplied with the operation signal S1 from the input means 2, it increases the base voltage of the transistor Q1 and also reduces the base voltage of the transistor Q2.

Accordingly, the transistor Q2 is set to the on-operation state to supply the rated voltage V1 to the relay coil RL1 through the input terminal 4, and also the transistor Q1 is set to the on-operation state to supply the rated voltage V1 to the relay coil RL1.

Accordingly, the relay coil RL1 is supplied with the rated voltage V1 through the input terminal 4, whereby the relay coil RL1 makes the movable iron piece 15 move and attach to the iron core 16 in the relay coil by the magnetic force which is generated by the rated current flowing through the relay coil RL1, thereby setting the main power source switch SW to the on-state. At this time, the holding voltage V2 is lower than the rated voltage V1, and thus the diode D2 is reversely biased and set to be non-conductive.

Further, when a predetermined time elapses from the state that the relay coil RL1 makes the movable iron piece 15 move and attach to the iron core 16 and the main power source switch SW is set to the on-operation state, the controller 11 increases the base voltage of the transistor Q2, whereby the transistor Q2 is set to the off-state to interrupt the rated voltage V1 supplied through the input terminal 4.

At this time, the controller 11 serving as the holding means maintains the on-operation of the transistor Q1, whereby only the holding voltage V2 is applied to the relay coil RL1 through the input terminal 5 and the diode D2 in this order. Accordingly, the relay coil RL1 maintains the attachment state between the movable iron piece 15 and the iron core 16 and thus the main power source switch SW is kept under the on-operation state.

As described above, when the predetermined time elapses from the time when the controller 11 is supplied with the operation signal S1, the controller 11 supplies only the holding voltage V2 to the relay coil RL1. The power consumption at this time is equal to about a quarter of the power consumption when only the rated voltage V1 is applied to the relay coil RL1 because the holding voltage V2 is equal to about the half of the rated voltage V1. Accordingly, the relay driving circuit 60 can promote the energy saving.

Here, the controller 11 monitors the output voltage (output current) of the main power source circuit 3 and the output voltage of the transformer T1 at all times. When it detects that no output voltage is supplied from the main power source circuit 3 in spite of supply of the output voltage of the transformer T1, the controller 11 judges that the movable iron piece 15 is moved away from the iron core 16 due to an external impact or the like and thus the main power source switch SW is set to the off-state, and reduces the base voltage of the transistor Q2.

Accordingly, the transistor Q2 supplies the rated voltage V1 to the relay coil RL1, and thus the rated voltage V1 is applied to the relay coil RL1. Accordingly, the movable iron piece 15 is moved and attached to the iron core 16 in the relay coil RL1, whereby the main power source switch SW is set to the on-state.

As described above, in the relay driving circuit 60, even when the movable iron piece 15 is separated from the relay coil RL1 due to an external impact or the like, the rated voltage V1 can be supplied to the relay coil RL1 again by detecting the separation of the movable iron piece 15. That is, the relay driving apparatus 60 can automatically restore the movement and attachment of the movable iron piece 15 to the relay coil RL1.

Further, the controller 11 serving as the driving means monitors the output voltage of the transformer T1 at all times, and when it is detected that the output voltage of the transformer T1 is lower than a predetermined level (that is, the voltage of the commercial power source (not shown) drops), the controller 11 serving as the control means reduces the base voltage of the transistor Q2 again, whereby the transistor Q2 supplies the rated voltage V1 to the relay coil RL1 again.

Accordingly, the rated voltage V1 is supplied through the input terminal 4 to the relay coil RL1 again, so that the rated voltage V1 is applied to the relay coil RL1, whereby the movable iron piece 15 can be attached to the iron core 16 more firmly by the relay coil RL1.

As described above, the relay driving circuit 60 avoids the separation of the movable iron piece 15 from the relay coil RL1 due to voltage drop of the commercial power source (not shown), and thus the voltage of the main power source can be supplied to each circuit portion (not shown) of the television set at all times, so that the operation reliability can be enhanced.

When a user carries out a predetermined input operation of turning off the main power source switch SW through input means 2 such as a remote commander or the like to set the main power source switch SW to the off-state, the input means 2 supplies the operation signal S1 corresponding to the user's operation to the controller 11. Accordingly, when the controller 11 is supplied with the operation signal S1 from the input means 2, the controller 11 operates to reduce the base voltage of the transistor Q1 and also increase the base voltage of the transistor Q2, so that no rated voltage is supplied to the relay coil RL1. Therefore, the movable iron piece 15 is separated from the iron core 16 in the relay coil RL1, and thus the main power source switch SW is set to the off-state.

In the above construction, when by monitoring the output voltage (output current) of the main power source circuit 3 and the output voltage of the transformer T1 at all times, the controller 11 detects that the output voltage of the main power source circuit 3 is not supplied although the output voltage of the transformer T1 is supplied, the controller 11 controls the transistor Q2 to supply the rated voltage V1 to the relay coil RL1 to attach the separated movable iron piece 15 to the iron core 16 in the relay coil RL1.

When by monitoring the variation of the voltage (current) at all times, the controller 11 detects voltage drop which causes the movable iron piece 15 to be separated from the iron core with only the holding voltage V2 supplied to the relay coil RL1, the controller 11 controls the transistor Q2 to supply the rated voltage V1 in place of the holding voltage V2 which has been supplied to the relay coil RL1.

Therefore, the controller 11 can attach the movable iron piece 15 to the relay coil RL1 more firmly, and thus even when the voltage drop of the commercial power source (not shown) occurs, the movable iron piece 15 can be attached to the relay coil RL1.

Further, when the relay coil RL1 is supplied with no rated voltage V1, the controller 11 supplies only the holding current (holding voltage V2) to the relay coil RL1, where by the controller 11 can promote the energy saving to the relay driving circuit 50.

According to the above construction, the controller 11 monitors the variation of the voltage (current) at all times, and when the variation of the voltage (current) is detected, it controls to supply the rated voltage V1 to the relay coil RL1. Accordingly, the attachment of the movable iron piece 15 to the relay coil RL1 is kept at all times with performing the energy saving, and even when the movable iron piece 15 is separated from the iron core 16, the movable iron piece 15 is automatically restored to its attachment position to the iron core 16. Therefore, the relay driving circuit can supply the main voltage to each circuit portion (not shown) in the television set with performing the energy saving, and thus the operation reliability can be enhanced.

[Third Embodiment]

Next, a third embodiment according to the present invention will be described hereunder.

Figure 5:
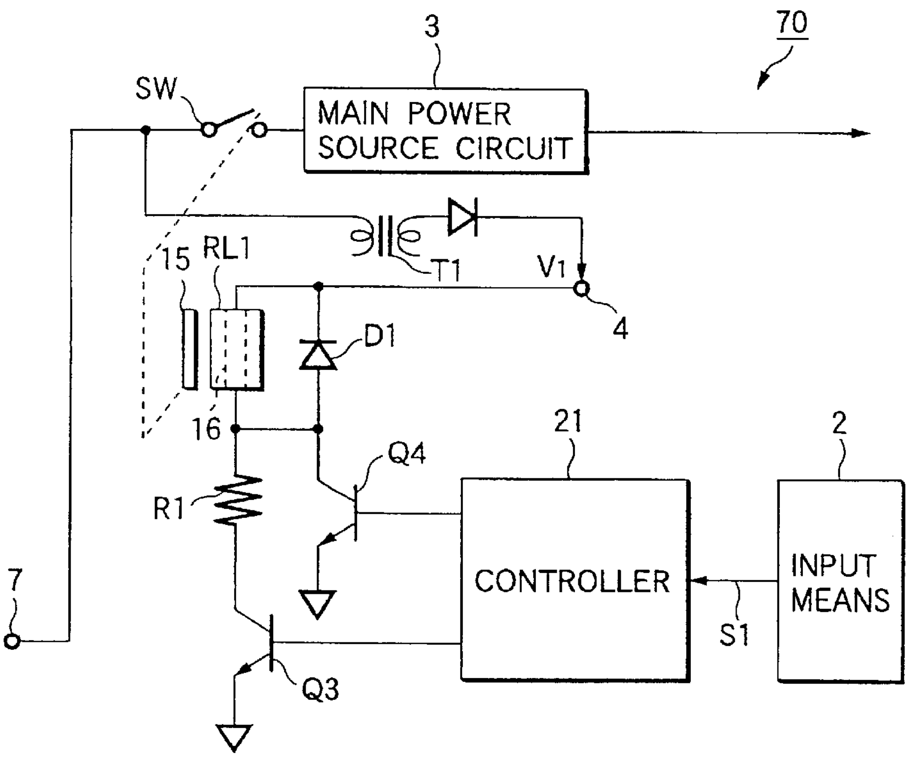
FIG. 5 is a block diagram showing the overall construction of a relay driving circuit according to a third embodiment of the present invention.

In FIG. 5, the corresponding parts to those of FIG. 1 are represented by the same reference numerals. Reference numeral 70 represents a relay driving circuit in a television set as a whole. When a user carries out a predetermined input operation of turning on a main power source from input means 2 such as a remote commander or the like to set the main power source switch SW to the on-state, the input means 2 supplies a controller 21 with the operation signal S1 corresponding to the user's operation.

The controller 21 is connected to an NPN type transistor Q3 and an NPN type transistor Q4 to which the rated voltage V1 is supplied through the input terminal 4. When the controller 21 is supplied with the operation signal S1 through the input means, it increases the base voltage of the transistor Q4, whereby the transistor Q4 is set to the on-state to supply the rated voltage V1 to the relay coil RL1.

Accordingly, when the rated voltage V1 is supplied to the relay coil RL1 through the input terminal 4, the relay coil RL1 makes the movable iron piece 15 which is away from the relay coil RL1 move and attach to the iron core 16 in the relay coil with the magnetic force obtained at this time by the relay coil RL1, thereby turning on the main power source switch SW.

When a predetermined time elapses from the state that the relay coil RL1 moves the movable iron piece 15 and attach it to the iron core 16 and thus the main power switch SW is set to the on-state, the base voltage of the transistor Q4 is reduced, and the base voltage of the transistor Q3 is increased.

In this case, the current supplied to the relay coil RL1 under application of the rated voltage V1 is restricted by a voltage-dividing resistor R1 which is connected in series between the relay coil RL1 and the transistor Q3, and this current becomes holding current which enables the relay coil RL1 to generate enough magnetic force to keep the attachment state between the movable iron piece 15 and the iron core 16.

Accordingly, the holding current is supplied to the relay coil RL1, so that the relay coil RL1 keeps the attachment state between the movable iron piece 15 and the iron core 16 and thus the main power source switch SW is kept under the on-state.

After the predetermined time elapses from the time when the operation signal S1 is supplied to the controller 21, the controller 21 switches to a passage (from the relay coil RL1 through the resistor R1 to the transistor Q3) through which current flows into the resistor R1 connected in series through the relay coil RL1 (that is, the transistor Q4 is set to the off-state and the transistor Q3 is set to the on-state).

At this time, the power consumption of the relay coil RL1 is equal to about a quarter of the power consumption when only the rated voltage V1 is applied to the relay coil RL1 because the holding voltage V2 is equal to about the half of the rated voltage V1. Further, the power consumption of the resistor R1 is also equal to about a quarter of the power consumption when only the rated voltage V1 is applied to the relay coil RL1 because the voltage of the terminal 4 is equal to about a half. Therefore, the power consumption when the controller 21 switches to the passage through which the current flows into the resistor R1 connected in series through the relay coil RL1 is equal to the sum of the power consumption of the relay coil RL1 and the power consumption of the resistor R1, and thus it is equal to about the half of the power consumption when only the rated voltage V1 is applied to the relay coil RL1. Accordingly, the relay driving circuit 70 can promote the power saving.

After the controller 21 switches to the passage through which the current flows in the resistor R1, the controller 21 periodically increases the base voltage of the transistor Q4 for a fixed time.

Accordingly, the controller 21 periodically sets the transistor Q4 to the on-state, and thus it periodically switches to the passage (from the relay coil RL1 to the transistor Q4) through which the original rated current can be supplied to the relay coil RL1 in place of the holding current which has been supplied to the relay coil RL1.

Accordingly, even when the movable iron piece 15 is separated from the iron core 16 (that is, the main power source switch SW is set to the off-state) due to instantaneous reduction of the AC voltage or the like, the relay coil RL1 is periodically supplied with the rated current from the input terminal 4, whereby the movable iron piece 15 can be moved and attached to the iron core 16 in the relay coil RL1 again with the magnetic force generated by the relay coil RL1 at this time, thereby setting the main power source switch SW to the on-state again.

With the above construction, by controlling the on-operation/off-operation of the transistors Q3 and Q4, for a predetermined time the controller 21 periodically performs the switching operation between the passage through which current flows in the resistor R1 provided in the relay driving circuit and the passage which no current flows in the resistor R1. Accordingly, the controller 21 can periodically supply the rated current or the holding current from one voltage source (rated voltage) to the relay coil RL1 while carrying out the switching operation between the rated current and the holding current periodically.

Further, even when the movable iron piece 15 is separated from the relay coil RL1, the controller 21 periodically supplies the rated current to the relay coil RL1 and thus the rated current is periodically supplied to the relay coil RL1, so that the movable iron piece 15 separated is attached to the iron core 16 again.

Still further, when the rated voltage is not supplied to the relay coil RL1, the controller 21 supplies only the holding voltage V2 to the relay coil RL1, whereby the controller 21 can promote the energy saving to the relay driving circuit 70.

According to the above construction, the controller 21 performs the control operation so that the passage through which the holding voltage is applied to the relay coil RL1 is periodically switched, for a predetermined time, to the passage through which the rated current is supplied to the relay coil RL1, so that even when the movable iron piece 15 is separated from the iron core 16, the movable iron piece 15 can be attached to the iron core 16 again. Therefore, the relay driving circuit 70 can automatically restore the supply of the main power source voltage to each circuit portion (not shown) of the television set, and the operation reliability can be enhanced.

In the third embodiment of the present invention, for the predetermined time the controller 21 periodically switches the passage through which the holding voltage is applied to the relay coil RL1 to the passage through which the rated voltage is applied to the relay coil RL1. However, the present invention is not limited to this embodiment. For example, as in the case of the second embodiment described above, the output voltage of the main power source circuit 3 and the output voltage of the transformer T1 may be monitored at all times, and the controller may switch to the passage through which the rated voltage is applied in accordance with the variation of the voltage (current) thus detected. In this case, the relay driving circuit can also enhance the operation reliability to each circuit portion (not shown) of the television set.

That is, under the state that the main power source switch is turned on (that is, the movable iron piece 15 is attached to the iron core 16 in the relay coil RL1), the controller 21 monitors the output voltage (output current) of the main power source circuit 3 and the output voltage of the transformer T1 at all times. If the controller 21 detects that the output voltage of the main power source circuit 3 is not supplied although the output voltage of the transformer T1 is supplied, the controller 21 judges that the movable iron piece 15 is separated from the iron core 16 due to an external impact or the like and thus the main power source switch SW is set to the off-state, and it sets the transistor Q4 to the on-state to supply the rated voltage V1 to the relay coil RL1. Accordingly, the movable iron piece 15 separated is attached to the iron core 16 in the relay coil RL1 again, whereby the main power source switch SW is set to the on-state. Therefore, even when the movable iron piece 15 is separated from the iron core 16, the relay driving circuit detects the separation of the movable iron piece 15 from the iron core 16 and supplies the rated voltage V1 to the relay coil RL1 again. That is, the relay driving circuit can automatically restore the movement and attachment of the movable iron piece 15, and automatically restore the supply of the main power source voltage to each circuit portion (not shown) of the television set, thereby enhancing the operation reliability.

Under the state that the main power switch is set to the on-state, the controller 21 monitors the output voltage of the transformer T1 at all times. If the controller 21 detects that the output voltage of the transformer T1 is reduced, it increases the base voltage of the transistor Q4 again to supply the rated voltage to the relay coil RL1, so that the controller 21 can attach the movable iron piece 15 to the iron core 16 more firmly than when the holding voltage is supplied to the relay coil RL1. Accordingly, the controller 21 can avoid the movable iron piece 15 from being separated from the relay coil RL1 due to the voltage drop of the commercial power source (not shown). Accordingly, the relay driving circuit can supply the main power source voltage to each circuit portion (not shown) of the television set, and thus the operation reliability can be enhanced.

As described above, the operation reliability to each circuit portion (not shown) of the television can be enhanced even when the output voltage of the main power source circuit 3 and the output of the transformer T1 are monitored at all times and the switching operation to the passage through which the rated voltage is supplied is carried out in accordance with the variation of the voltage (current) thus detected.

[Fourth Embodiment]

Figure 6:
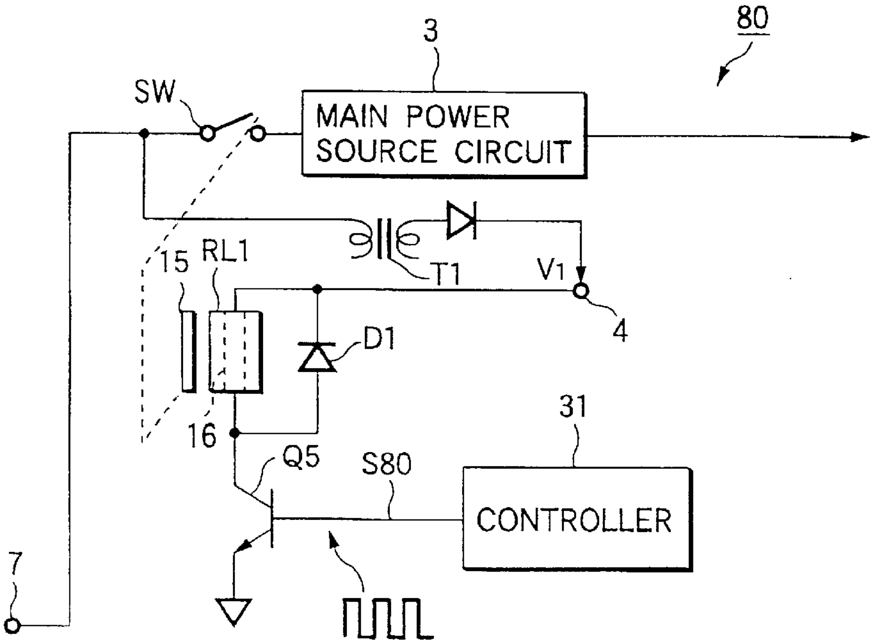
FIG. 6 is a block diagram showing the overall construction of a relay driving circuit according to a fourth embodiment of the present invention.

In FIG. 6, the corresponding parts to those of FIG. 1 are represented by the same reference numerals. Reference numeral 80 represents a relay driving circuit in a television set as a whole. When a user carries out a predetermined input operation of turning on the main power source through the input means 2 such as a remote commander or the like to set the main power source switch SW to an on-state, the input means 2 supplies the operation signal S1 corresponding to the user's operation to a controller 31.

The controller 31 is connected to an NPN type transistor Q5 for supplying the rated voltage to a relay coil RL1 through an input terminal 4. When the controller 31 is supplied with the operation signal S1 through the input means, the controller 31 supplies the base of the transistor Q5 with a pulse signal S80 which has been subjected to predetermined pulse width modulation (PWM), thereby controlling the transistor Q5 to carry out the on-operation (supplying the rated voltage to the relay coil RL1) or the off-operation (intercepting the supply of the rated voltage to the relay coil RL1).

Figures 7A, 7B:
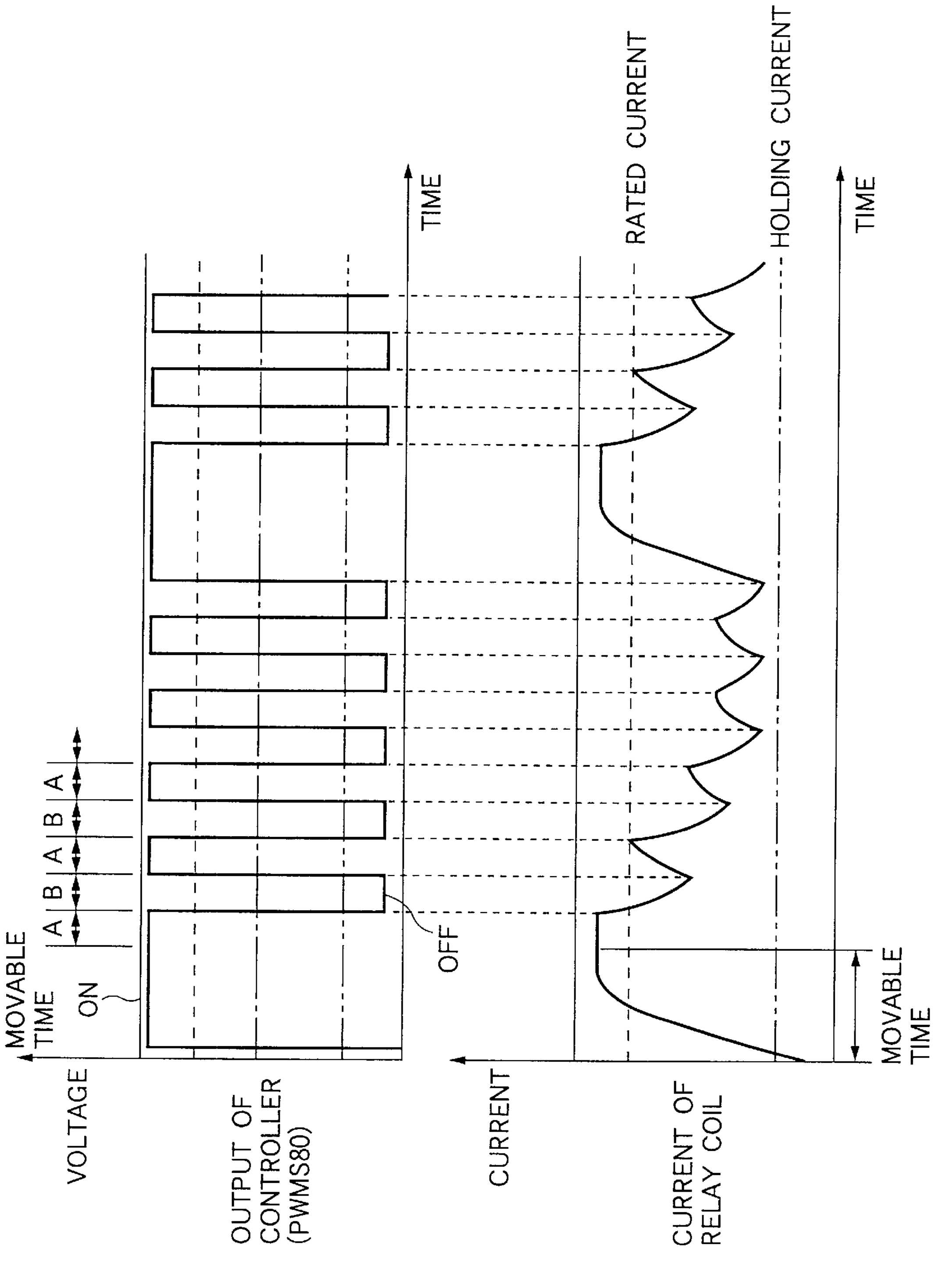
FIGS. 7A and 7B are schematic diagrams showing the correlation between the output of a controller and the current of a relay coil.

In this case, the pulse signal S80 supplied from the controller 31 to the base of the transistor Q5 is set to have a logical level of "Hi" during a period for which the movable iron piece 15 separated from the iron core 16 is moved and attached to the iron core 16 (hereinafter referred to as "movable time") as shown in FIG. 7A. Accordingly, the transistor Q5 is kept in the on-state to supply the rated voltage to the relay coil RL1. At this time, the rated current supplied to the relay coil RL1 under the rated voltage reaches its peak within the movable time, so that the relay coil RL1 moves and attracts the movable iron piece 15 (FIG. 7B).

When the time exceeds the movable time, the pulse signal S80 is set to have a logical level of "Hi" during a period A (FIG. 7A), so that the transistor Q5 is kept in the on-state during the period A to supply the rated voltage (rated current) to the relay coil RL1.

The pulse signal S80 is set to have a logical level of "Lo" during a period B having the same time interval as the period A (FIG. 7A), so that the transistor Q5 is set to and kept in the off-state during the period B to intercept the rated voltage (rated current) supplied to the relay coil RL1. At this time, the rated current flowing in the relay coil RL1 is not immediately reduced to zero, but gradually reduced because the current based on regenerative energy of the diode D1 flows in the relay coil RL1 (FIG. 7B).

As described above, when the time is over the movable time, the pulse signal S80 alternately switches its logical level between "Hi" and "Lo" in the period A, the period B, the period A, the period B, . . . (that is, the transistor Q5 is alternately switched between the on-state and the off-state). Accordingly, the rated current flowing in the relay coil RL1 is gradually reduced to the holding current with which the relay coil RL1 generates the magnetic force under which the movable iron piece 15 is merely kept to be attached to the iron core 16. The controller 31 is designed to supply the pulse signal S80 with which the current flowing in the relay coil RL1 is more than the holding current.

As described above, the controller 31 supplies the pulse signal S80 to the base of the transistor Q5 to supply the relay coil RL1 with the rated current with which the movable iron piece 15 is moved and attached to the iron core 16, and then supplies the relay coil RL1 with the holding current to keep the attachment state after the movable iron piece 15 is attached to the iron core 16.

Accordingly, the power consumption at this time is equal to about a quarter of the power consumption when only the rated current to move the movable iron piece 15 and attach it to the iron core 16 is supplied to the relay coil RL1 because the holding current is equal to about the half of the rated current. Accordingly, the relay driving circuit 80 can promote the energy saving.

Here, the pulse signal S80 is set to periodically have a logical level of "Hi" for only the movable time (FIG. 7A) after it is set to the alternately switching state in which the logical level is alternately switched between the "Hi" level and the "Lo" level. Accordingly, the rated current periodically flows into the relay coil RL1. (FIG. 7B)

Accordingly, even when the main power source switch SW is set to the off-state due to reduction of the AC voltage or the like, the rated voltage is periodically supplied from the input terminal 4 to the relay coil RL1, so that the relay coil RL1 can move the movable iron piece 15 and attach it to the iron core 16 again with the magnetic force generated in the relay coil RL1 at this time, thereby setting the main power source switch SW to the on-state again.

In the above construction, the controller 31 supplies the pulse signal S80 to the transistor Q5 to control the current supplied from the transistor Q5 to the relay coil RL1.

Therefore, the controller 31 can supply the rated current or the holding current from one voltage source (rated voltage) to the relay coil RL1 while periodically switching the current to be supplied between the rated current and the holding current.

The controller 31 supplies the transistor Q5 with the pulse signal S80 in which the logical level is periodically set to "Hi" for the time period corresponding to the movable time, whereby the rated current is periodically supplied to the relay coil RL1.

Accordingly, even when the movable iron piece 15 is separated from the relay coil RL1, the controller 31 controls the transistor Q5 with the pulse signal S80 so that the rated current is periodically supplied to the relay coil RL1, whereby the movable iron piece 15 separated from the relay coil RL1 is attached to the relay coil RL1 again.

According to the construction described above, even when the movable iron core 15 is separated from the relay coil RL1, the movable iron core 15 can be attached to the relay coil RL1 again with promoting the energy saving by controlling the on-operation/off-operation of the transistor Q5 on the basis of the pulse signal S80. Accordingly, the relay driving circuit can automatically restore the supply of the main power source voltage to each circuit portion (not shown) of the television set, and the operation reliability can be enhanced.

In the fourth embodiment described above, the controller 31 periodically supplies the base of the transistor Q5 with the pulse signal S80 having the logical level which is set to "Hi" for the time period corresponding to the movable time. However, the present invention is not limited to this embodiment, and it may be applied to the same manner as the second embodiment in which the output voltage of the main power source circuit 3 and the output voltage of the transformer T1 are monitored at all times, and the supply of the pulse signal is varied in accordance with the variation of the voltage (current) detected. In this case, the relay driving apparatus can also enhance the operation reliability to each circuit portion of the television set.

That is, under the state that the main power source switch SW is set to the on-state (that is, the movable iron piece 15 is attached to the iron core 16 in the relay coil RL1), the controller 31 monitors the output voltage of the main power source circuit 3 and the output voltage of the transformer T1, and if it detects that the output voltage of the main power source circuit 3 is not supplied although the output voltage of the transformer T1 is supplied, the controller 31 judges that the movable iron piece 15 is separated from the iron core 16 due to an external impact or the like and the main power source switch SW is set to the off-state. Therefore, in place of the pulse signal which is set to have the alternately-switched logical level and has been supplied to the base of the transistor Q5, the controller 31 supplies the base of the transistor Q5 with the pulse signal in which the logical level is set to "Hi" for the time period corresponding to the movable time, thereby supplying the rated current to the relay coil RL1. Therefore, the movable iron piece 15 separated from the iron core 16 is attached to the iron core 16 in the relay coil RL1 again, and the main power source switch SW is set to the on-state. Accordingly, even when the movable iron piece 15 is separated from the iron core 16, the relay driving circuit can supply the rated voltage V1 to the relay coil RL1 again by detecting the separation of the movable iron piece 15. That is, the relay driving circuit can automatically restore the movement and attachment of the movable iron piece 15 to the iron core 16, and thus the supply of the main power source voltage to each circuit portion of the television set can be automatically restored. Therefore, the operation reliability can be enhanced.

Under the state that the main power source switch is set to the on-state, the controller 31 monitors the output voltage of the transformer T1, and if it is detected that the output voltage of the transformer T1 drops, the controller 31 supplies the base of the transistor Q5 with the pulse signal in which the logical level is set to "Hi" for the time period corresponding to the movable time in place of the pulse signal in which the logical level is alternately switched between "Hi" and "Lo", thereby supplying the rated voltage to the relay coil RL1. Accordingly, the controller 31 can attach the movable iron piece 16 to the iron core 16 more firmly than when the holding current is supplied to the relay coil RL1. Therefore, in the relay driving circuit, the movable iron piece 15 can be avoided from being separated from the relay coil RL1 due to the voltage drop of the commercial power source (not shown) and the main power source voltage can be supplied to each circuit portion of the television set at all times, so that the operation reliability can be enhanced.

As described above, the operation reliability to each circuit portion of the television set can be enhanced even when both of the output voltage of the main power source circuit 3 and the output voltage of the transformer T1 are monitored at all times, and the supply of the pulse signal is varied in accordance with variation of the voltage (current) detected.

[Fifth Embodiment]

Figure 8:
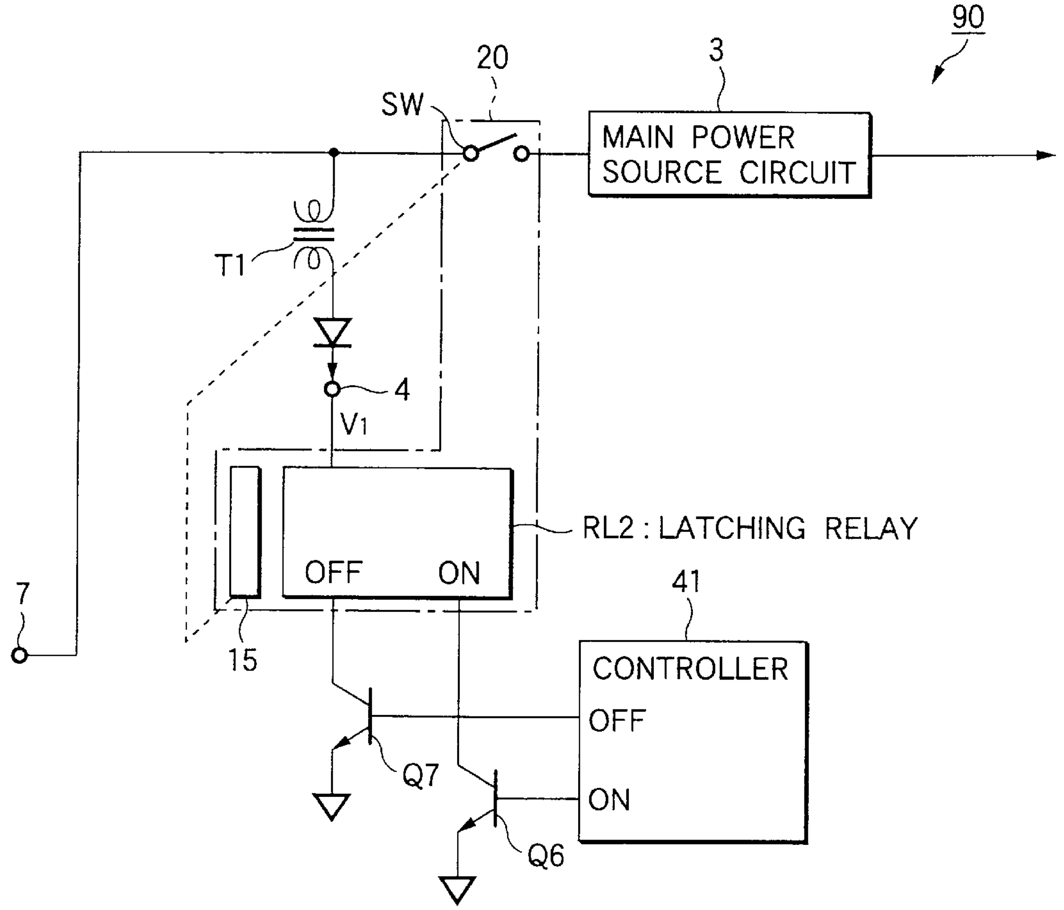
FIG. 8 is a block diagram showing the overall construction of a relay driving circuit according to a fifth embodiment of the present invention.

Next, a fifth embodiment according to the present invention will be described below. In FIG. 8, the corresponding parts to those of FIG. 1 are represented by the same reference numerals.

In FIG. 8, reference numeral 90 represents a relay driving circuit in a television set as a whole. When a user carries out a predetermined input operation of turning on the main power source through the input means 2 such as a remote commander or the like to set the main power source switch SW to the on-state, the input means 2 supplies the operation signal S1 corresponding to the user's operation to a controller 41.

The controller 41 is connected to NPN type transistors Q6 and Q7 for supplying the rated voltage to a latching relay RL2 through the input terminal 4, and upon receiving the operation signal S1 from the input means 2, the controller 41 increases the base voltage of the transistor Q6, whereby the transistor Q6 is set to the on-state to supply the rated voltage to the latching relay RL2.

Figure 9:
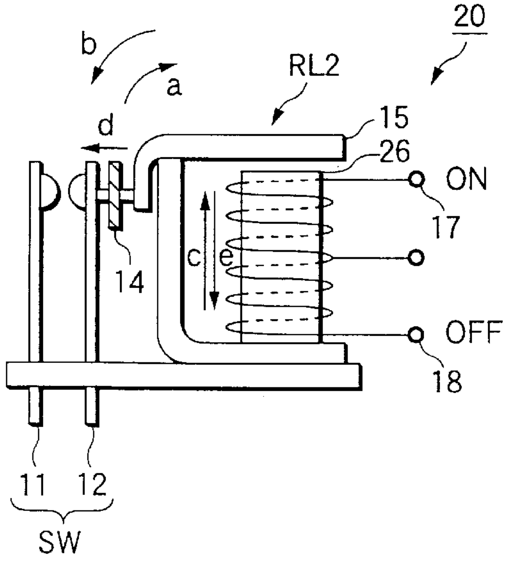
FIG. 9 is a block diagram showing the construction of the switch operating portion.

Here, FIG. 9 shows the operation relationship between the latching relay RL2 and the main power source switch SW in a switch operation portion 20 (FIG. 8). In FIG. 9, the corresponding parts to those of FIG. 3 are represented by the same reference numerals. When the transistor Q6 supplies the rated voltage to the latching relay RL2, the rated voltage flows through the input terminal 4 (FIG. 8) and a coil output terminal 17 in this order.

In this case, enough magnetic force to move the movable iron piece 15 is generated in the direction of an arrow e in a permanent magnet 26 of the latching relay RL2, whereby the latching relay RL2 move the movable iron piece 15 and attach it to the permanent magnet 26 to set the main power source switch SW to the on-state.

Under the state that the movable iron piece 15 is attached to the permanent magnet 26 in the latching relay RL2, the controller 41 sets the transistor Q6 to the off-state (that is, reduces the base voltage of the transistor Q6) after a predetermined time elapses from the time when the transistor Q6 is set to the on-state.

In this case, no rated voltage is supplied to the latching relay RL2. However, enough magnetic force to keep the attachment state between the movable iron piece 15 and the permanent magnet 26 in the latching relay RL2 when the movable iron piece 15 is attached to the permanent magnet 26 is originally generated in the direction of the arrow e, so that the attachment state can be kept without any rated voltage being supplied and thus the main power source switch SW is kept in the on-state.

After a predetermined time elapses from the time when the movable iron piece 15 is moved and attached to the permanent magnet 26 by supplying the rated voltage to the latching relay RL2, the controller 41 stops the supply of the rated voltage. However, once the movable iron piece 15 is attached to the permanent magnet 26, the attachment state is kept by the magnetic force which is inherent to the permanent magnet 26. Accordingly, the power consumption in this case can be further reduced because it is sufficient that the rated voltage to move the movable iron piece 15 and attach it to the permanent magnet 26 once is merely supplied to the latching relay RL2 for a predetermined time. Accordingly, the relay driving can promote the energy saving.

Further, the controller 41 is designed to periodically increase the base voltage of the transistor Q6 for a predetermined time, whereby the rated voltage is periodically supplied to the latching relay RL2.

Accordingly, when the main power source SW is set to the off-state due to an external impact or the like, the rated voltage is periodically supplied from the input terminal 4 to the latching relay RL2, so that the latching relay RL2 can move the movable iron piece 15 and attach it to the permanent magnet 26 again by the magnetic force generated at this time, thereby setting the main power source switch SW to the on-state again.

When a user carries out a predetermined input operation of turning off the main power source from the input means 2 such as a remote commander or the like to set the main power source switch SW to the off-state, the input means 2 supplies the operation signal S1 corresponding to the user's operation to the controller 41. In response to the operation signal S1, the controller 41 increases the base voltage of the transistor Q7 to supply the rated voltage to the latching relay RL2. In this case, the magnetic force to move the movable iron piece 15 and attach it to the permanent magnet 26 is generated in the opposite direction (indicated by the arrow c (FIG. 8)) to the magnetic force of the permanent magnet 26 in the latching relay RL2. Accordingly, the former magnetic force and the latter magnetic force in this case are offset by each other, so that the total magnetic force is vanished. Therefore, the movable iron piece 15 is separated from the permanent magnet 26 in the latching relay RL2, and the main power source switch SW is set to the off-state and thus off-operated.

In the above construction, the controller 41 controls the transistor Q6 so that the rated voltage is periodically supplied to the latching relay RL2 for a fixed time. Accordingly, the latching relay RL2 can keep the attachment of the movable iron piece 15 without the rated voltage being supplied at all times.

Further, even when the movable iron piece 15 is separated from the latching relay RL2, the controller 41 can attach the separated movable iron piece 15 to the latching relay RL2 again because the rated voltage is periodically supplied to the latching relay RL2.

According to the above construction, it is controlled so that the relay driving circuit 90 is provided with the latching relay RL2, and the controller 41 periodically supplies the rated voltage to the latching relay RL2 for a fixed time. Therefore, the power consumption can be further reduced, and even when the movable iron piece 15 is separated from the latching relay RL2, the movable iron piece 15 can be attached to the latching relay RL2 again. Accordingly, the relay driving circuit can automatically restore the supply of the main power source voltage to each circuit portion (not shown) of the television set and the operation reliability can be enhanced.

In the fifth embodiment of the present invention, the controller 41 periodically supplies the rated voltage to the latching relay RL2. However, the present invention is not limited to this embodiment, and it may be applied to the same case as the second embodiment in which both of the output voltage of the main power source circuit and the output voltage of the transformer are monitored at all times and the transistor Q6 is switched to the on-operation state in accordance with the variation of the voltage (current) detected. In this case, the relay driving circuit can also enhance the operation reliability to each circuit portion of the television set.

That is, under the state that the main power source switch is set to the on-state (that is, the movable iron piece 15 is attached to the permanent magnet 26 in the relay coil RL2), the controller 41 monitors the output voltage (output current) of the main power source circuit and the output voltage of the transformer T1 at all times, and if it detects that the output voltage of the main power source circuit 3 is not supplied although the output voltage of the transformer T1 is supplied, the controller 41 judges that the movable iron piece 15 is separated from the permanent magnet 26 due to an external impact or the like and thus the main power source switch SW is in the off-state. Therefore, the controller 41 increases the base voltage of the transistor Q6 to supply the rated voltage to the latching relay RL2. Accordingly, the movable iron piece 15 separated from the permanent magnet 26 is attached to the permanent magnet 26 in the relay coil RL2 again, and the main power source switch SW is set to the on-state. Therefore, even when the movable iron piece 15 is separated from the permanent magnet 26, the rated voltage V1 can be supplied to the relay coil RL2 again by detecting the separation of the movable iron piece 15 in the relay driving circuit. That is, the relay driving circuit can automatically restore the movement and attachment of the movable iron piece 15, and automatically restore the supply of the main power source voltage to each circuit portion of the television set, so that the operation reliability can be enhanced.

Further, when the movable iron piece 15 is moved and attached to the permanent magnet 26, the attachment state is kept by the magnetic force inherent to the permanent magnet 26 in the latching relay RL2. Accordingly, there may be such a situation that the attachment state is kept by the latching relay RL2 although the controller 41 turns off the main power source switch SW (that is, separates the movable iron piece from the latching relay RL2). In this case, if the controller 41 detects that the output voltage of the main power source circuit 3 is supplied although the controller 41 turns off the main power source switch SW, the controller 41 judges that the attachment state is kept by the latching relay RL2, and increases the base voltage of the transistor Q7 to surely turn off the main power source. Accordingly, the operation reliability can be enhanced.

As described above, the output voltage of the main power source circuit 3 and the output voltage of the transformer T1 are monitored at all times, and even when the transistor Q6 is switched to the on-operation state in accordance with the variation of the voltage (current) detected, the operation reliability to each circuit portion of the television set can be enhanced.

[Other Embodiments]

In the first to fifth embodiments, the relay driving circuit is equipped in the television set. However, the present invention is not limited to these embodiments, and the relay driving apparatus (circuit) of the present invention may be broadly applied to any apparatus having an electrical switch circuit, such as electronic equipment having a remote operation function using a remote controller or an on/off switching function using a sub switch such as a video tape recorder or the like, electronic equipment having a standby function other than the sub switch such as a telephone, a personal computer or the like, electronic equipment of obtaining driving electric power through an AC adapter, or the like.

As described above, according to the present invention, in the relay driving apparatus in which the relay is once subjected to the rated driving operation by supplying the predetermined rated voltage to the relay so that it is shifted to the driving state, and then the voltage is reduced to keep the driving state of the relay, the driving state of the relay is monitored, and on the basis of the monitoring result, the relay is subjected to the rated driving operation or the rated voltage is periodically supplied to the relay which is kept in the driving state, thereby enhancing the operation reliability with promoting the energy saving.

What is claimed is:

1. A relay driving apparatus for subjecting a relay to a rated driving operation to connect a power source circuit to a commercial power supply by supplying a predetermined rated voltage from a transformer to the relay for shifting the relay to a driving state and for reducing the predetermined rated voltage to maintain the driving state of the relay, comprising:

monitoring means for monitoring a driving state of the relay by detecting an output voltage of the power source circuit and detecting an output voltage of the transformer; and control means for carrying out the rated driving operation on the relay to shift the relay back into the driving state in response to an output of said monitoring means when said monitoring means detects a low voltage at said power source circuit or said transformer.

2. The relay driving apparatus as claimed in claim 1, wherein the control means controls the rated driving operation on the relay maintained under the driving state when the relay is set to an off-state.

3. The relay driving apparatus as claimed in claim 1, wherein the control means controls the rated driving operation on the relay maintained under the driving state when the control means detects the reduced output of a power source driving the relay.

4. The relay driving apparatus as claimed in claim 1, wherein the control means controls one of the rated driving operation on the relay and the driving state of the relay by switching a voltage value supplied to the relay.

5. A relay driving apparatus for subjecting a relay to a rated driving operation to connect a power source circuit to a commercial power supply by supplying a predetermined rated voltage to the relay for shifting the relay to a driving state and for reducing the predetermined rated voltage to maintain the driving state of the relay, comprising:

monitoring means for monitoring a driving state of the relay by detecting an output voltage of the power source circuit; and control means for periodically supplying the determined rated voltage in the form of pulses to the relay kept under the driving state and for shifting the relay to the driving state in response to a low voltage detected by the monitoring means.

6. The relay driving apparatus as claimed in claim 5, wherein the control means controls one of the rated driving operation on the relay and the driving state of the relay by switching a voltage value supplied to the relay.

* * * * *